United States Patent [19]

Kondoh et al.

[11] 4,148,658
[45] Apr. 10, 1979

[54] PHOTOPOLYMERIZABLE COMPOSITION COMPRISING MULTI-PHOTOINITIATOR SYSTEM

[75] Inventors: Syunichi Kondoh; Akihiro Matsufuji; Akira Umehara, all of Asaka; Akira Sato; Akira Ogawa, both of Minami-ashigara, Japan

[73] Assignee: Fuji Photo Film Co., Ltd., Minami-ashigara, Japan

[21] Appl. No.: 855,638

[22] Filed: Nov. 29, 1977

[30] Foreign Application Priority Data

Dec. 2, 1976 [JP] Japan .............................. 51/145341

[51] Int. Cl.² .......................... G03C 1/68; G03C 5/00
[52] U.S. Cl. .................................. 96/115 P; 96/35.1; 96/36; 96/115 R; 204/159.24
[58] Field of Search .................. 96/115 P, 115 R, 36, 96/35.1; 204/159.24, 159.18

[56] References Cited

U.S. PATENT DOCUMENTS

| | | | |
|---|---|---|---|
| 3,847,610 | 11/1974 | Laridon et al. | 96/35.1 |
| 3,962,056 | 6/1976 | Pacifici et al. | 204/159.15 |
| 3,966,573 | 6/1976 | Bean | 204/159.23 |
| 4,043,887 | 8/1977 | Pacifici et al. | 204/159.23 |
| 4,058,398 | 11/1977 | Osada et al. | 96/27 R |
| 4,080,275 | 3/1978 | Photis et al. | 204/159.23 |
| 4,080,382 | 3/1978 | Pacifici et al. | 260/591 |
| 4,082,686 | 12/1977 | Van Allen et al. | 96/115 R |

OTHER PUBLICATIONS

Kosar, "Light-Sensitive Systems", 8/1965, pp. 160-188, esp. pp. 167-170.
DeForest, "Photoresist", 6/1975, pp. 35 et seq.

*Primary Examiner*—Edward C. Kimlin
*Attorney, Agent, or Firm*—Sughrue, Rothwell, Mion, Zinn and Macpeak

[57] ABSTRACT

A photopolymerizable composition comprising, as essential components, (A) at least one compound having one or more addition polymerizable ethylenically unsaturated double bonds and (B) a photopolymerization initiator composition comprising (i) a combination of at least one compound (a) and at least one compound (b), (ii) a combination of at least one compound (a) and at least one compound (c) or (iii) a combination of at least one compound (a), at least one compound (b) and at least one compound (c);

wherein compound (a) is a benzoylmethylenebenzothiazolylidenethiazolidone compound selected from the group consisting of 2-benzoylmethylene-5-benzothiazolylidenethiazolidin-4-one and the substituted derivatives thereof represented by the following general formula (I):

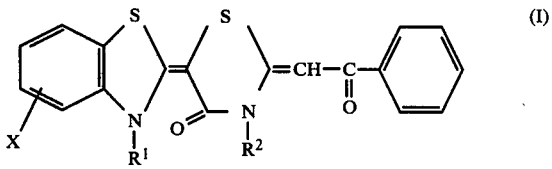

wherein $R^1$, $R^2$ and X are as defined in the specification;

compound (b) is a tertiary or polyamine compound selected from the group consisting of tertiary amines represented by the following general formula (II):

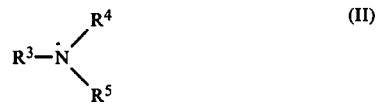

wherein $R^3$, $R^4$ and $R^5$ are as defined in the specification; and compound (c) is a disubstituted aminoarylcarbonyl compound selected from a defined group.

22 Claims, No Drawings

PHOTOPOLYMERIZABLE COMPOSITION COMPRISING MULTI-PHOTOINITIATOR SYSTEM

BACKGROUND OF THE INVENTION

1. Field of the Invention

This invention relates to photopolymerizable compositions and, more particularly, to photopolymerizable compositions, which contain a photopolymerization initiator of a novel composition and which are sensitive, e.g., even to argon laser light.

2. Description of the Prior Art

In the past, it is well known to form an image by preparing a photopolymerizable composition comprising an unsaturated compound having at least one addition polymerizable ethylenically unsaturated double bond (hereinafter referred to as an ethylenically unsaturated compound), a photopolymerization initiator and, if required, a high molecular weight material having a film-forming ability, a thermal polymerization inhibitor, a plasticizer, and the like, preparing a solution of the photopolymerizable composition, coating the solution of the photopolymerizable composition on a support to form a light-sensitive material having thereon a layer of the photopolymerizable composition (hereinafter "light-sensitive layer"), image-wise exposing the light-sensitive layer through a desired original image, thereby causing a photopolymerization to occur in the exposed areas and harden the light-sensitive layer in the exposed areas, and then dissolving out the light-sensitive layer in the unhardened areas by treating the light-sensitive layer with an organic solvent capable of dissolving only the unhardened light-sensitive layer, thus forming an image by the hardened light-sensitive layer; or to form an image by adhering the above-described light-sensitive material to another image support (with either of the support of the light-sensitive material or the image support being transparent) to form a laminate, image-wise exposing through the transparent support, thereby causing photopolymerization to occur in the exposed areas of the light-sensitive layer, resulting in a change in the adhesive strength of the light-sensitive layer to the support of the light-sensitive material and to the image support so that the relative relationship between the adhesive strength to the support of the light-sensitive layer and the adhesive strength to the image support in the exposed areas becomes different from that in the unexposed areas, and then peeling off (delaminating) both supports from each other to separate them with the light-sensitive layer in the unexposed areas remaining adhered to one of the supports and the light-sensitive layer in the exposed areas remaining adhered to the other support, thus forming images by the light-sensitive layer on the respective supports. In the above methods, benzil, benzoin, anthraquinone or Michler's ketone have been used as photopolymerization initiators. However, although photopolymerizable compositions in which these photopolymerization initiators are used are sensitive to ultraviolet light of relatively shorter wavelengths, they are not very sensitive to ultraviolet light of longer wavelengths and visible light such as light of an argon laser and, thus, do not exhibit any polymerization-initiation ability. This becomes a problem because it is very desired as an image-forming technique to be able to use visible light or laser light which permits scanning exposure as the light for exposure in the above image-formation.

SUMMARY OF THE INVENTION

An object of this invention is to solve the above-described problem of conventional photopolymerizable compositions.

Accordingly, this invention in one embodiment provides a photopolymerizable composition comprising, as essential components, (A) at least one compound having one or more addition polymerizable ethylenically unsaturated double bonds and (B) a photopolymerization initiator composition comprising (i) a combination of at least one compound (a) and at least one compound (b), (ii) a combination of at least one compound (a) and at least one compound (c) or (iii) a combination of at least one compound (a), at least one compound (b) and at least one compound (c); wherein compound (a) is a benzoylmethylenebenzothiazolylidenethiazolidone compound selected from the group consisting of 2-benzoylmethylene-5-benzothiazolilidenethiazolidin-4-one and the substituted derivatives thereof represented by the general formula (I):

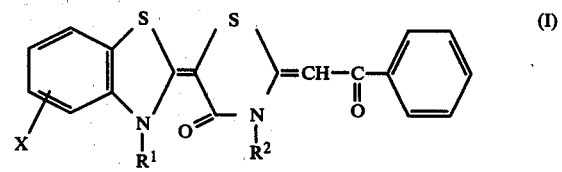

wherein $R^1$ and $R^2$, which may be the same or different, each represents a hydrogen atom, an alkyl group, a substituted alkyl group, an aryl group, a substituted aryl group or an aralkyl group and X represents a substituent exhibiting a Hammett's sigma ($\sigma$) constant ranging from about $-0.9$ to about $+0.5$; wherein compound (b) is a tertiary or polyamine compound selected from the group consisting of tertiary amines represented by the general formula (II):

wherein $R^3$, $R^4$ and $R^5$, which may be the same or different, each represents an alkyl group, a substituted alkyl group, an aryl group, a substituted aryl group or an aralkyl group; and polyamines; and wherein compound (c) is disubstituted aminoarylcarbonyl compound selected from the group consisting of p-(disubstituted amino)-benzophenones, p-(disubstituted amino)acetophenones, p-(disubstituted amino)propiophenones, bis[p-disubstituted amino)phenyl]ketones, p-(disubstituted amino)phenyl styryl ketones, 4-(disubstituted amino)benzoins, p-(disubstituted amino)benzaldehydes, p-(disubstituted amino)benzoic esters, 4-(disubstituted amino)-1-naphthaldehydes, p-(disubstituted amino)styryl phenyl ketones and p-(disubstituted amino)styryl styryl ketones, wherein the substituents, which may be the same or different, of the above-described disubstituted amino groups are an alkyl group, an aryl group, an alkylaryl group or an aralkyl group, and wherein, in addition to the disubstituted amino group, the carbon atoms of the aryl ring having the disubstituted amino group thereon or the carbon atoms of another aryl ring where another aryl ring is present of the disubstituted aminoarylcarbonyl compounds may be substituted with one or more substituents exhibiting a Hammett's sigma ($\sigma$) constant ranging from about −0.9 to about +0.7.

This invention further provides in another embodiment a photopolymerizable composition which comprises components (A) and (B) as described above and a component (C) comprising at least one high molecular weight material which is compatible with components (A) and (B) and which has a film-forming ability (component (C) being referred to hereinafter as a binder).

DETAILED DESCRIPTION OF THE INVENTION

Suitable substituents X in the general formula (I) above exhibiting a Hammett's sigma ($\sigma$) constant ranging from about −0.9 to about +0.5 can include, e.g., a hydrogen atom, an alkyl group, preferably an alkyl group having 1 to 4 carbon atoms (e.g., a methyl group, an ethyl group, a propyl group, an isopropyl group, a butyl group, a tert-butyl group, etc.), a phenyl group, a trifluoromethyl group, an acetyl group, an ethoxycarbonyl group, a carboxyl group, a carboxylato group (—COO$^-$), an amino group, a methylamino group, a dimethylamino group, an ethylamino group, a diethylamino group, an acetylamino group, a —PO$_3$H group, a methoxy group, an ethoxy group, a propoxy group, an isopropoxy group, a butoxy group, a pentyloxy group, a phenoxy group, a hydroxy group, an acetoxy group, a methylthio group, an ethylthio group, an isopropylthio group, a mercapto group, an acetylthio group, a thiocyano group (—SCN), a methylsulfinyl group, an ethylsulfinyl group, a methylsulfonyl group, an ethylsulfonyl group, an aminosulfonyl group, a dimethylsulfonio group (—S$^+$(CH$_3$)$_2$), a sulfonato group (—SO$_3^-$), a fluorine atom, a chlorine atom, a bromine atom, an iodine atom, an iodyl group, a trimethylsilyl group (—Si(CH$_3$)$_3$), a triethylsilyl group, a trimethylstannyl group (—Sn(CH$_3$)$_3$), etc. Of these substituents, a hydrogen atom, a methyl group, an ethyl group, a methoxy group, an ethoxy group, a dimethylamino group, a diethylamino group, a chlorine atom and a bromine atom are preferred. A —PO$_3$H group, a methylthio group, an ethylthio group, an isopropylthio group, a mercapto group, an acetylthio group, a methylsulfinyl group, an ethylsulfinyl group, a dimethylsulfonio group and a sulfonato group are less preferred because on polymerization a lower defree of polymerization results. The Hammett's sigma ($\sigma$) constant is well-known and the definition as used herein is as set forth in John E. Leffler and Ernest Grunwald, *Rates and Equilibria of Organic Reactions*, John Wiley and Sons, Inc., New York (1963).

Suitable examples of R$^1$ and R$^2$ in the above-described general formula (I) are given below. Suitable alkyl groups include straight, branched or cyclic alkyl groups having 1 to 18 carbon atoms. Specific examples of suitable alkyl groups are a methyl group, an ethyl group, a propyl group, a butyl group, a pentyl group, a hexyl group, a heptyl group, an octyl group, a nonyl group, a decyl group, a dodecyl group, an octadecyl group, an isopropyl group, an isobutyl group, an isopentyl group, an isohexyl group, a sec-butyl group, a neopentyl group, a tert-butyl group, a tert-pentyl group, a cyclopentyl group, a cyclohexyl group, a cycloheptyl group and a 2-norbornyl group. Of these groups, straight, branched or cyclic alkyl groups having 1 to 10 carbon atoms are preferred.

Examples of suitable substituents for the substituted alkyl group for R$^1$ and R$^2$ include one or more of a halogen atom (e.g., a fluorine atom, a chlorine atom, a bromine atom or an iodine atom) and hydroxyl group, and suitable alkyl moieties include straight, branched or cyclic alkyl moieties having 1 to 18 carbon atoms, preferably 1 to 10 carbon atoms. Specific examples of suitable substituted alkyl groups are a chloromethyl group, a bromethyl group, a 2-chloroethyl group, a 2,2,2-trichloroethyl group, a 2-chloropentyl group, a 1-(chloromethyl)propyl group, a 10-bromodecyl group, an 18-methyloctadecyl group, a chlorocyclohexyl group, a hydroxymethyl group, a 2-hydroxyethyl group, a 2-hydroxybutyl group, a 5-hydroxypentyl group, a 10-hydroxydecyl group, a 2-hydroxyoctadecyl group, a 2-(hydroxymethyl)ethyl group, a hydroxycyclohexyl group and a 3-hydroxy-2-norbornyl group.

Suitable aryl groups for R$^1$ and R$^2$ include a residue of one benzene ring, a residue of two or more condensed benzene rings, a residue of two combined benzene rings and a residue of a condensed ring formed from a benzene ring and a 5-membered unsaturated ring. Suitable substituted aryl groups include residues in which one or more of the ring-forming carbon atoms of the above-described aryl groups are substituted with substituents such as a halogen atom (e.g., a fluorine atom, a chlorine atom, a bromine atom or an iodine atom), a nitro group, an amino group, a substituted amino group [such as a monoalkyl-substituted amino group (with examples of the alkyl moiety being, e.g., a methyl group, an ethyl group, a propyl group, a pentyl group, an isopropyl group, a sec-butyl group and an isopentyl group), a dialkylamino group (with examples of the alkyl moiety being, e.g., the same as the alkyl moiety of the monoalkyl-substituted alkyl group) or a monoacylamino group (with examples of the acyl moiety being, e.g., an acetyl group, a propionyl group, a butyryl group, an isobutyryl group and a valeryl group)], a cyano group, an alkyl group (e.g., a straight, branched or cyclic alkyl group having 1 to 18 carbon atoms, preferably a straight, branched or cyclic alkyl group having 1 to 10 carbon atoms with specific examples thereof being as described hereinbefore for R$^1$ and R$^2$), a haloalkyl group (such as a chloromethyl group, a 2-chloromethyl group, a 5-chloropentyl group and a trifluoromethyl group), an alkoxy group (with examples of the alkyl moiety being, e.g., a methyl group, an ethyl group, a butyl group, a pentyl group, an isopropyl group, an isopentyl group, a 2-methylbutyl group and a sec-butyl group), an aryloxy group (with examples of the aryl moiety being, e.g., a phenyl group, a 1-naphthyl group and a 2-naphthyl group), an alkoxycarbonyl group (with examples of the alkyl moiety being, e.g., a methyl group, an ethyl group, a propyl group, an isopropyl group and a butyl group), an acyloxy group (with examples of the acyl moiety being, e.g., the same as described for the acyl moiety of the monoacylamino group) or an alkoxysulfonyl group (with examples of the alkyl moiety being, e.g., the same as the alkyl moiety of the alkoxyl group).

Specific examples of suitable aryl groups and substituted aryl groups for R$^1$ and R$^2$ include a phenyl group, a chlorophenyl group, a nitrophenyl group, an aminophenyl group, a (methylamino)phenyl group, an (ethylamino)phenyl group, a (dimethylamino)phenyl group, an acetylaminophenyl group, a tolyl group, an ethylphenyl group, a (chloromethyl)-phenyl group, an acetylphenyl group, a phenoxyphenyl group, a methoxycarbonylphenyl group, an ethoxycarbonylphenyl group, an acetoxyphenyl group, a methoxysulfonylphenyl group, a naphthyl group, a 2-amino-1-naphthyl group, a 1-dimethylamino-2-naphthyl group, a chloronaphthyl group, a methylnaphthyl group, an anthryl group, a phenanthryl group, an indenyl group, a biphenylyl group, a chlorobiphenylyl group, an aminobiphenylyl group, a methylbiphenylyl group and an acenaphthenyl group. Where two or more substituents are present, they may be the same or different. Of these groups, a residue containing one benzene ring and a residue containing a benzene ring with one or more of the above-described substituents, which may be the same or different, thereon are preferred.

Suitable examples of aralkyl groups for $R^1$ and $R_2$ include an alkyl moiety which may be the residue of a straight, branched or cyclic alkyl group having 1 to 10 carbon atoms, preferably 1 to 5 carbon atoms, which can be substituted with a phenyl group or a naphthyl group. Specific examples of suitable aralkyl groups for $R^1$ and $R^2$ are a benzyl group, a phenethyl group, a 3-phenylpropyl group, a 3-phenylhexyl group, a 10-phenyldecyl group and a 4-phenylcyclohexyl group.

The benzoylmethylenebenzothiazolylidenethiazolidones represented by the general formula (I) can be synthesized according to the method described in *Bull. Soc. Chimie Belges*, 57, pp. 364 – 372 (1948) (*Chemical Abstracts*, 44, columns 60e to 61d (1950)).

Specific examples of suitable benzoylmethylenebenzothiazolylidenethiazolidones of the general formula (I) which can be used as compound (a) in the photopolymerization initiator employed as component (B) in this invention are 2-benzoylmethylene-3-methyl-5-(3'-methylbenzothiazolylidene)-thiazolidin-4-one, 2-benzoylmethylene-3-ethyl-5-(3'-methyl-benzothiazolylidene)thiazolidin-4-one, 2-benzoylmethylene-3-methyl-5-(3'-methyl-5'-methoxybenzothiazolylidene)-thiazolidin-4-one, 2-benzoylmethylene-3-ethyl-5-(3'-methyl-5'-methoxybenzo-thiazolylidene)thiazolidin-4-one, 2-benzoylmethylene-3-ethyl-5-(3'-methyl-5'-chlorobenzothiazolylidene)thiazolidin-4-one, 2-benzoylmethylene-3-ethyl-5-(3',5'-dimethylbenzo-thiazolylidene)thiazolidin-4-one, 2-benzoylmethylene-3-ethyl-5-(3'-ethyl-5'-methoxybenzothiazolylidene)-thiazolidin-4-one and 2-benzoylmethylene-3-methyl-5-(3'-ethyl-5'-chlorobenzo-thiazolylidene)thiazolidin-4-one.

Examples of suitable substituents $R^3$, $R^4$ and $R^5$ in the above-described general formula (II) are the same as those described hereinbefore for $R^1$ in the general formula (I).

Specific examples of tertiary amines represented by the general formula (II) which can be used as compound (b) in the photopolymerization initiator employed as component (B) in this invention are tri(alkyl and/or aryl)amines such as trimethylamine, triethylamine, tripropylamine, tributylamine, tripentylamine, tri(decyl)amine, methyldiethylamine, ethyldibutylamine, dimethyldecylamine, dimethylcyclohexylamine, diethylcyclohexylamine, N,N-dimethylaniline, N,N-diethyl-aniline, N,N-dimethylbenzylamine, N,N-diethylbenzylamine, N-benzyl-N-methylaniline, N-benzyl-N-ethylaniline, N-benzyl-N-propylaniline, N-phenethyl-N-methylaniline, N-phenethyl-N-ethylaniline, N,N-diphenylaniline, N,N-dibenzylaniline, triphenylamine, tribenzylamine, tris(hydroxyalkyl)amines such as nitrilotrimethanol, 2,2',2''-nitrilotriethanol (or triethanolamine), 1,1',1''-nitrilotripropanol, 2,2',2''-nitrilotripropanol, etc.; N,N-diethanolaniline; dimethylaniline derivatives such as p-methyl-N,N-dimethylaniline, p-nitro-N,N-dimethylaniline, bis[(p-dimethylamino)-phenyl]methane, etc.; and bis[(p-dibenzylamino)-phenyl]methane.

Specific examples of polyamine compounds which can be used as compound (b) in the photopolymerization initiator employed as component (B) in this invention are alkylene diamines and arylene diamines such as methylenediamine, ethylenediamine, trimethylenediamine, tetramethylenediamine, pentamethylenediamine, hexamethylenediamine, decamethylenediamine, propylenediamine, butylenediamine, 1,4-cyclohexanediamine, phenylenediamine, (2-aminomethylbutyl)amine, diethylenetriamine, triethylenetetramine and mexamethylenetetramine.

Of the above tertiary and polyamine compounds, triethanolamine, N-methyl-N-benzylaniline, N-ethyl-N-benzylaniline and N-propyl-N-benzylaniline are preferred.

The above-described amine compounds may be used individually or as a mixture of two or more thereof.

Examples of suitable substituents that exhibit a Hammett's sigma ($\sigma$) constant ranging from about −0.9 to about +0.7 which may be additionally present on the disubstituted amino-arylcarbonyl compounds used as compound (c) in the photopolymerization initiator employed as component (B) in this inventiion are the same as those described above for the substituents exhibiting a $\sigma$ value ranging from about −0.9 to about +0.5, as well as a cyano group.

Suitable examples of substituents of the disubstituted amino group of the disubstituted amino-arylcarbonyl compounds are an alkyl group, an aryl group, an alkylaryl group or an aralkyl group, and the substituents of the disubstituted amino group may be the same or different. Examples of suitable alkyl groups, aryl groups and aralkyl groups are the same as those described above for the alkyl group, the aryl group and the aralkyl group represented by $R^1$. Examples of suitable alkylaryl groups are the same aryl groups as exemplified above for $R^1$ which are substituted with the same alkyl groups as exemplified above for $R^1$. Preferred alkyl groups are a methyl group, an ethyl group, a propyl group, an isopropyl group, a butyl group, a sec-butyl group, an isobutyl group, an amyl group and an isoamyl group. The aryl group is preferably a phenyl group, and preferred aralkyl groups are a benzyl group and a phenethyl group. The substituted aryl group is preferably a tolyl group.

Specific examples if disubstituted amino-arylcarbonyl compounds used as compound (c) of the photopolymerization initiator (B) of this invention are p-(disubstituted amino)-benzophenones such as p-(dimethylamino)benzophenone and p-(diethylamino)benzophenone; p-(disubstituted amino)acetophenones such as p-(dimethylamino)acetophenone and p-(diethylamino)acetophenone; p-(disubstituted amino)propiophenones such as p-(dimethylamino)propiophenone and p-(diethylamino)propiophenone; bis[p-(disubstituted amino)-phenyl]ketones such as bis[p-(dimethylamino)phenyl]ketone (Michler's ketone) and bis[p-(diethylamino)phenyl]ketone; p-(disubstituted amino)-phenyl styryl ketones such as p-(dimethylamino)phenyl styryl ketone, p-(dimethylamino)phenyl p-methylstyryl ketone, p-(dimethylamino)phenyl m-chlorostyryl ketone, p-(dimethylamino)phenyl p-methoxystyryl ketone, p-(dimethylamino)phenyl p-(dimethylamino)styryl ketone, p-(diethylamino)phenyl styryl ketone, p-

(diethylamino)phenyl m-methylstyryl ketone, p-(diethylamino)phenyl p-bromostyryl ketone and p-(diethylamino)phenyl p-methoxystyryl ketone; 4-(disubstituted amino)benzoins such as 4-(dimethylamino)benzoin and 4-(diethylamino)benzoin; p-(disubstituted amino)benzaldehydes such as p-(dimethylamino)benzaldehyde, p-dimethylamino-m-chlorobenzaldehyde, p-dimethylamino-m-methylbenzaldehyde, p-(diethylamino)benzaldehyde, p-diethyl-amino-m-bromobenzaldehyde and p-diethylamino-m-methoxybenzaldehyde; p-(disubstituted amino)benzoic acid esters such as methyl p-(dimethylamino)benzoate, ethyl p-(dimethylamino)-benzoate, benzyl p-(dimethylamino)benzoate, methyl p-(diethyl-amino)benzoate and ethyl p-(diethylamino)benzoate; 4-disubstituted-naphthaldehyde and 4-diethylamino-1-naphthaldehyde; p-(disubstituted amino)styryl phenyl ketones such as p-(dimethyl-amino)styryl phenyl ketone, p-(dimethylamino)styryl p-tolyl ketone, p-(dimethylamino)styryl m-chlorophenyl ketone, p-(dimethylamino)styryl p-methoxyphenyl ketone, p-(diethylamino)-styryl phenyl ketone, p-(diethylamino)styryl p-bromophenyl ketone and p-(diethylamino)styryl p-methoxyphenyl ketone; and p-(disubstituted amino)styryl styryl ketones such as p-(dimethylamino)styryl styryl ketone, p-(dimethylamino)styryl p-methylstyryl ketone, p-(dimethylamino)styryl m-chlorostyryl ketone, p-(dimethylamino)styryl p-methoxystyryl ketone, p-(diethylamino)styryl styryl ketone, p-(diethylamino)styryl p-bromostyryl ketone and p-(diethylamino)styryl m-methylstyryl ketone.

Particularly effective amino-arylcarbonyl compounds which can be used as compound (c) in this invention are represented by the following general formulae (III) to (VI):

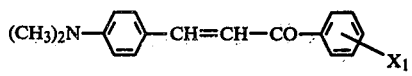

(III)

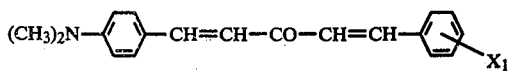

(IV)

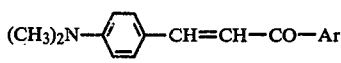

(V)

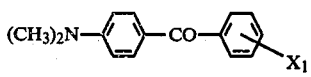

(VI)

wherein $X_1$ is a substituent having a Hammett's $\sigma$ constant of about $-0.9$ to about $+0.7$, and Ar is an aryl group as described above for $R^1$ and $R^2$.

The photopolymerization initiator composition (B) which is present in the photopolymerizable composition of this invention and which is a characteristic component of the photopolymerizable composition of this invention comprises (i) a combination of at least one compound (a) and at least one compound (b), (ii) a combination of at least one compound (a) and at least one compound (c) or (iii) a combination of at least one compound (a), at least one compound (b) and at least one compound (c). In any of these combinations, the effect of this invention is particularly markedly exhibited when the weight ratio of the compound (a) and the other compounds ranges from about 1:9 to about 9:1, preferably 1:3 to 3:1. The weight ratio of the compounds (b) and (c) can be optionally varied as desired, but generally ranges from about 1:100 to about 100:1, preferably about 1:10 to about 10:1.

Compounds having one or more addition polymerizable ethylenically unsaturated double bonds, i.e., ethylenically unsaturated compounds as component (A) present in the photopolymerizable composition of this invention include monomers (including esters of an oligoester and an unsaturated carboxylic acid), as well as prepolymers such as dimers or trimers and oligomers thereof with other compounds and further include mixtures or copolymers thereof. Specific examples include monomers such as acrylic acid, methacrylic acid, itaconic acid, crotonic acid, isocrotonic acid, maleic acid, esters of aliphatic polyhydric alcohols, e.g., di- or polyacrylic esters, di- or poly-methacrylic esters or di- or polyitaconic esters with aliphatic polyhydric alcohols (e.g., having 1 to 20, preferably 1 to 10, carbon atoms and containing 1 to 8, preferably 1 to 6, hydroxy groups) such as ethylene glycol, triethylene glycol, tetraethylene glycol, tetramethylene glycol, neopentyl glycol, 1,10-decanediol, trimethylolethane, trimethylolpropane, 1,2-butanediol, 1,3-butanediol, propylene glycol, pentaerythritol, dipentaerythritol, tripentaerythritol, other poly-(e.g., tetra- to deca-)pentaerythritols, sorbitol, d-mannitol, diols of ethylenically unsaturated aliphatic acids (e.g., undecylenic acid, oleic acid, etc.) and chemically modified substances (e.g., wherein some of the double bonds in the molecule are cleaved or a hydroxyl group thereof is acetylated) thereof, etc. A suitable range of the number of carbon atoms in the esters of the ethylenically unsaturated double bond-containing organic acids for use in this invention is 3 to about 20, preferably 3 to 6, carbon atoms.

Typical specific examples of suitable ethylenically unsaturated compounds as component (A) include: trimethylolpropane triacrylate, trimethylolethane triacrylate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol trisitaconate, dipentaerythritol pentaitaconate, dipentaerythritol hexaitaconate, ethylene glycol dimethacrylate, 1,3-butanediol diacrylate, 1,3-butanediol dimethacrylate, 1,4-butanediol diitaconate, sorbitol triacrylate, sorbitol tetraacrylate, sorbitol tetramethacrylate, sorbitol pentaacrylate, sorbitol hexaacrylate, 1,4-butylene modified diacrylate, trimethylolpropane modified triacrylate, pentaerythritol modified triacrylate and mixtures thereof, etc.

Addition polymerizable oligoester acrylates and oligoester methacrylates can also be used.

Suitable addition polymerizable oligoester acrylates and oligoester methacrylates (hereinafter "oligoester (meth)-acrylates") which can be used herein are reaction products prepared by the esterification of acrylic acid and/or methacrylic acid, one or more polybasic acids and one or more polyhydric alcohols, and can be represented by the general formula (VII):

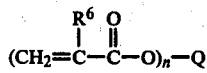

wherein $R^6$ represents a hydrogen atom or a methyl group, Q represents an ester group containing at least one ester bond which comprises one or more polyhydric alcohols and one or more polybasic acids, and n represents an integer of 1 to 6. Preferred reaction products as above-described have a molecular weight of from 246 to about 3,000, more preferably from 284 to about 2,000.

Examples of polyhydric alcohols comprising part of the ester group Q include polyhydric alcohols such as ethylene glycol, 1,2-propylene glycol, 1,4-butanediol, 1,6-hexanediol, trimethylolpropane, trimethylolethane, 1,2,6-hexanetriol, glycerin, pentaerythritol and soritol, and polyether type polyhydric alcohols such as diethylene glycol, triethylene glycol, tetraethylene glycol, polyethylene glycol, dipropylene glycol, tripropylene glycol and polypropylene glycol. Preferred polyethylene glycols have a molecular weight of from 60 to about 600, more preferably from 60 to about 400, and preferred polypropylene glycols have a molecular weight of from 76 to about 700, more preferably from 76 to about 500. Preferred polyhydric alcohols are aliphatic polyhydroxy compounds which contain from 2 to 30 carbon atoms, more preferably from 2 to 20 carbon atoms, and have from 2 to 6 —OH groups, more preferably from 2 to 4 —OH groups. Good results are obtained utilizing such aliphatic polyhydroxy compounds having a molecular weight of from 60 to about 700, more preferably from 60 to about 500.

On the other hand, examples of suitable polybasic acids comprising a part of the ester group Q include aromatic polybasic acids such as phthalic acid, isophthalic acid, terephthalic acid, tetrachlorophthalic acid, tetrabromophthalic acid, trimellitic acid, pyromellitic acid, benzophenone dicarboxylic acid, resorcinol diacetic acid and bisphenol A diacetic acid, unsaturated aliphatic polybasic acids such as maleic acid, fumaric acid, citraconic acid, mesaconic acid, itaconic acid, and 5-norbornene-2,3-dicarboxylic acid, and saturated aliphatic polybasic acids such as malonic acid, succinic acid, glutaric acid, adipic acid, pimelic acid, sebacic acid, dodecanoic acid, tetrahydrophthalic acid and norbornane-2,3-dicarboxylic acid. Preferred polybasic acids have from 3 to 30 carbon atoms, more preferably from 4 to 20 carbon atoms (including the carboxylic carbon atom) and contain from 2 to 6 —COOH groups, more preferably from 2 to 4 —COOH groups. Such polybasic acids have a molecular weight of from 104 to about 600, with excellent results being obtained using polybasic acids having a molecular weight of from 116 to about 500.

For those polybasic acids which comprise an aromatic ring, such a ring may be substituted and, in such instance, the substituent is most preferably in alkyl group having 1 to 5 carbon atoms, a halogen (Cl, Br, I) atom or a haloalkyl group comprising an alkyl moiety having 1 to 5 carbon atoms and Cl, Br or I.

As indicated, the ester group Q includes those composed of one polyhydric alcohol and two or more polybasic acids and those composed of two or more polyhydric alcohols and one or more polybasic acids. Further, the ester group Q includes those containing one molecule of polyhydric alcohol and one molecule of polybasic acid and those containing two or more molecules of one or both of the polyhydric alcohol and the polybasic acid. In short, any ester group Q can be used if at least one ester bond is present.

Further, the ester group Q includes those having a hydroxyl group, those having a hydroxyl group esterified with a monobasic carboxylic acid, preferably an aliphatic acid having 1 to 10 carbon atoms, most preferably 1 to 5 carbon atoms (excluding the carboxylic carbon) or an aryl carboxylic acid comprising 1 or 2 aromatic rings, preferably 1 ring, and having 6 to 15 carbon atoms, more preferably 6 to 10 carbon atoms (excluding the carboxylic carbon), and those having a hydroxyl group substituted with an alkoxy group, preferably an alkoxy group with from 1 to 5 carbon atoms, such as a methoxy group or an ethoxy group. Further, Q may contain a carboxyl group, i.e., a free carboxyl group(s) which is not esterified. For instance, an example of such a Q group containing a carboxyl group is:

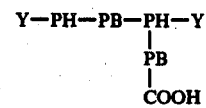

free carboxyl
wherein PB represents a polybasic acid and PH represents a polyhydric alcohol.

The number n in the formula (VII) and the number of the ester bonds included in Q can be controlled by changing the kind and molar ratio of acrylic acid or methacrylic acid, polyhydric alcohol and polybasic acid in the production of the oligoester (meth) acrylate. It is generally preferred for the value of n to be 1 to 6 to present gelation during synthesis. When the value of n is 2 or more, an oligoester (meth) acrylate wherein either only an acryloyl group or only a methacryloyl group is included in the same molecule may be used or an oligoester (meth) acrylate wherein both an acryloyl group and a methacryloyl group are included at a desired ratio in the same molecule may be used.

For example, the ester group can take various forms, some of which include, for instance: $Y_a$—PH—PB—PH—$Y_b$, $Y_a$(PH—PB)$_c$PH—$Y_b$,

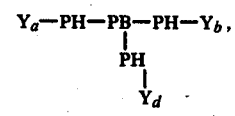

and the like, wherein Y is

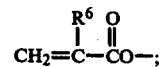

a is an integer of 1 to 5; b is an integer of 1 to 5; c is an integer of 2 to 5; d is an integer of 1 to 5; a + b is 2 to 6; and a + b + d is 3 to 6.

The oligoester (meth) acrylate can be easily synthesized in a yield of 80% or more by heating a solution containing acrylic acid or methacrylic acid, a polyhydric alcohol and a polybasic acid in the ratio desired in the final product at 60 to 100° C in the presence of a thermal polymerization inhibitor such as hydroquinone, p-methoxyphenol or phenothiazine (0.1 to 0.01% by weight based on the sum total of acrylic acid and methacrylic acid) and a dehydration catalyst such as sulfuric acid or zinc chloride (0.1 to 0.01% by weight based on the sum total of acrylic acid and methacrylic acid) (see Japanese Patent Application (OPI) No. 133491/74, abstracted in Chemical Abstracts, 82, 172726a (1975)).

Examples of oligoester (meth) acrylates which can be used in the present invention are shown in Table 1 below. However, other various kinds of oligoester (meth) acrylates, (for example, those described in U.S. Pat. No. 3,732,107 and in Japanese Patent Application (OPI) 133,491/74, abstracted in Chemical Abstracts, 82, 172726a (1975)) can be suitably used in the present invention. In Table 1, Y in the formula represents either an acryloyl group ($CH_2$=CH—CO—) or a methacryloyl group

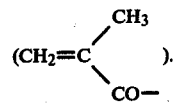

TABLE 1

Oligoester (Meth)Acrylate

Y—$OCH_2CH_2OOC$—CH=CH—$COOCH_2CH_2OH$

Y—$OCH_2\overset{CH_3}{\underset{|}{CH}}$—OOC—$CH_2CH_2$—COO—$\overset{CH_3}{\underset{|}{CH}}CH_2OH$ Y—O$\leftarrow CH_2CH_2O\rightarrow_{\overline{2}}$OC—$C_6H_4$—CO—(O$CH_2CH_2)_{\overline{2}}$OH Y—$\leftarrow$O$(CH_2)_4$OOC$(CH_2)_4$—CO$\rightarrow_{\overline{2}}$O$\leftarrow CH_2\rightarrow_{\overline{4}}$OOC—$CH_3$

Y—$OCH_2CH_2OOC$—$C_6H_4$—$COOCH_2CH_2$O—Y

Y$\leftarrow OCH_2CH_2OOC$—$C_6H_4$—CO$\rightarrow_{\overline{2}}$$OCH_2CH_2$O—Y Y—O$\leftarrow CH_2CH_2O\rightarrow_{\overline{3}}$OC—CH=CH—CO—(O$CH_2CH_2)_{\overline{3}}$O—Y Y—$OCH_2CH_2OOC$⟨norbornane⟩$COOCH_2CH_2$O—Y Y$\leftarrow OCH_2CH_2)_3OOC$—$(CH_2)_4$—CO$\rightarrow_{\overline{2}}$O$\leftarrow CH_2CH_2O\rightarrow_{\overline{3}}$Y Y$\leftarrow (OCH_2CH_2)_2OOC$—$C_6H_4$—CO$\rightarrow_{\overline{3}}$O$\leftarrow CH_2CH_2O\rightarrow_{\overline{2}}$Y Y$\leftarrow OCH_2CH_2\rightarrow_{\overline{10}}OOC$—$CH_2$—COO$\leftarrow CH_2CH_2O\rightarrow_{\overline{10}}$Y Y$\leftarrow OCH_2CH_2\rightarrow_{\overline{10}}OOC$—⟨benzophenone⟩—COO$\leftarrow CH_2CH_2O\rightarrow_{\overline{10}}$Y Y—$OCH_2CH_2OOC$—⟨benzene⟩—COO—$CH_2CH_2$—O—Y
Y—$OCH_2CH_2OOC$—

Y$\leftarrow OCH_2CH_2\rightarrow_{\overline{2}}OOC$—⟨benzene⟩—COO$\leftarrow CH_2CH_2O\rightarrow_{\overline{2}}$Y
Y$\leftarrow OCH_2CH_2\rightarrow_{\overline{2}}OOC$—

$\begin{matrix} Y-OCH_2\\ \phantom{Y-OCH_2}\diagdown\\ \phantom{Y-OCH_2}\phantom{x}CH-OOC-C_6H_4-COO-CH\\ \phantom{Y-OCH_2}\diagup\\ Y-OCH_2 \end{matrix} \begin{matrix} CH_2O-Y\\ \diagup\\ \\ \diagdown\\ CH_2O-Y \end{matrix}$ $\begin{matrix} Y-OCH_2\\ \diagdown\\ CH-OOC\leftarrow CH_2\rightarrow_{\overline{4}}COO-CH\\ \diagup\\ Y-OCH_2 \end{matrix} \begin{matrix} CH_2O-Y\\ \diagup\\ \\ \diagdown\\ CH_2O-Y \end{matrix}$ $\begin{matrix} Y-OCH_2 & C_2H_5\\ \diagdown & \diagup\\ & C\\ \diagup & \diagdown\\ Y-OCH_2 & CH_2OOC-C_6H_4-COOCH_2 \end{matrix} \begin{matrix} C_2H_5 & CH_2O-Y\\ \diagdown & \diagup\\ C\\ \diagup & \diagdown\\ & CH_2O-Y \end{matrix}$ $\begin{matrix} Y-OCH_2 & C_2H_5\\ \diagdown & \diagup\\ & C\\ \diagup & \diagdown\\ Y-OCH_2 & CH_2OOC-CH=CH-COOCH_2 \end{matrix} \begin{matrix} C_2H_5 & CH_2O-Y\\ \diagdown & \diagup\\ C\\ \diagup & \diagdown\\ & CH_2O-Y \end{matrix}$ $\begin{matrix} Y-OCH_2 & CH_3\\ \diagdown & \diagup\\ & C\\ \diagup & \diagdown\\ Y-OCH_2 & CH_2OOC\leftarrow CH_2\rightarrow_{\overline{3}}COOCH_2 \end{matrix} \begin{matrix} CH_3 & CH_2O-Y\\ \diagdown & \diagup\\ C\\ \diagup & \diagdown\\ & CH_2O-Y \end{matrix}$ $\begin{matrix} Y-OCH_2\\ \diagdown\\ Y-OCH_2-C-CH_2OOC-C_6H_4-COOCH_2-C-CH_2O-Y\\ \diagup\\ Y-OCH_2 \end{matrix} \begin{matrix} CH_2O-Y\\ \\ \\ \\ CH_2O-Y \end{matrix}$ TABLE 1-continued Oligoester (Meth)Acrylate

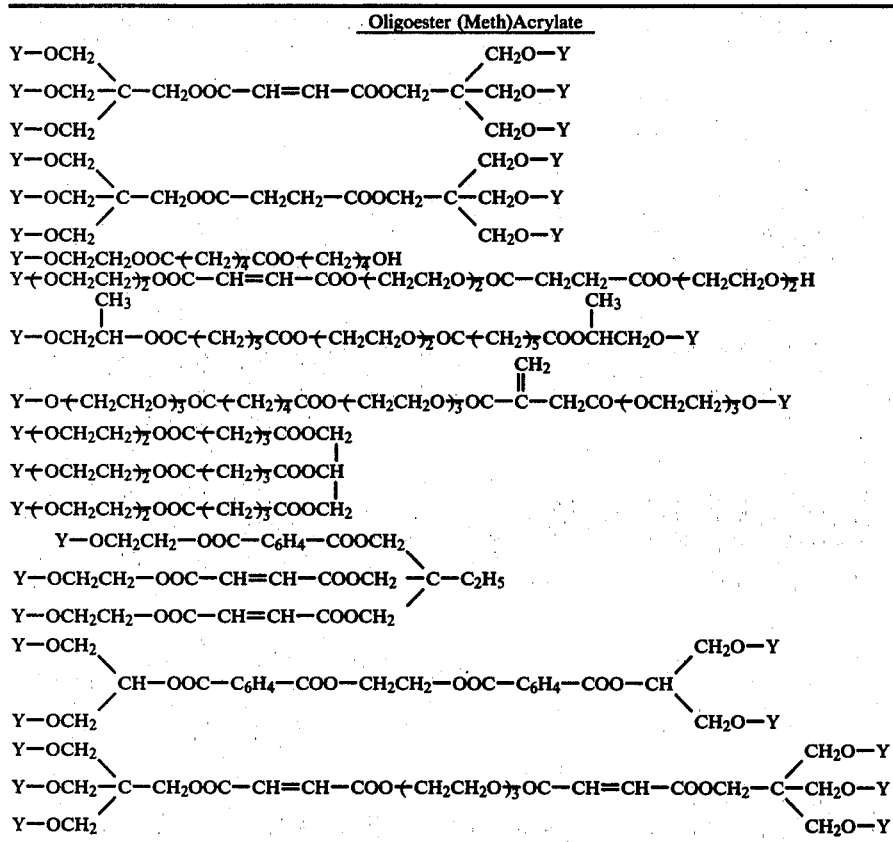

The above-described components (A) and (B) are used in a weight ratio of about 0.1:100 to about 20:100, preferably 0.1:100 to 10:100, of component (B) to component (A).

In the first embodiment of this invention, the photopolymerizable composition comprises the above-described components (A) and (B) as essential components, and in the second embodiment of this invention, these components (A) and (B) are mixed with a component (C) (binder). Other auxiliary additives such as a thermal polymerization inhibitor, a coloring agent or a plasticizer can also be present in addition to components (A), (B) and (C).

The binder, component (C), is a component necessary to form a tough resist film when the photopolymerizable composition of this invention is used as a light-sensitive material for a photo resist. The binder must have characteristics such that it is compatible with components (A) and (B) so that demixing (or separation) does not occur during all of the steps of preparing a light-sensitive material involving the preparation of a coating solution of the photopolymerizable composition, coating the coating solution of the photopolymerizable composition and drying the coated layer of the photopolymerizable composition, the light-sensitive and resist layer formed can be developed after image-wise exposure by, e.g., solution development, peel-apart development, etc., and a tough film as a resist layer can be formed. Binders with a softening point of less than about 100° C. result in a resist shape which tends to be unstable. As a result, binders with a softening point of higher than about 100° C. are preferred.

Specific examples of suitable binders as component (C) are homopolymers and copolymers, for example, chlorinated polyolefins such as chlorinated polyethylene or chlorinated polypropylene, polymethyl methacrylate, polyacrylic acid, polymethacrylic acid, a polyacrylic acid alkyl ester (with examples of the alkyl moiety being a methyl group, an ethyl group, a butyl group, etc.), a copolymer of an acrylic acid alkyl ester (with the alkyl moiety being the same as described above) with at least one monomer such as acrylonitrile, vinyl chloride, vinylidene chloride, styrene and butadiene, polyvinyl chloride, a copolymer of vinyl chloride with acrylonitrile, polyvinylidene chloride, a copolymer of vinylidene chloride with acrylonitrile, polyvinyl acetate, a copolymer of vinyl acetate with vinyl chloride, polyvinyl alcohol, polyvinyl pyrrolidone, polyacrylonitrile, a copolymer of acrylonitrile with styrene, a copolymer of acrylonitrile, butadiene and styrene, a polyvinyl alkyl ether (with examples of the alkyl moiety being a methyl group, an ethyl group, an isopropyl group, a butyl group, etc.), polymethyl vinyl ketone, polyethyl vinyl ketone, polyethylene, polypropylene, polybutene, polystyrene, poly-α-methylstyrene, polyamide (nylon-6, nylon-6,6 etc.), poly-1,3-butadiene, polyisoprene, a polyurethane, polyethylene terephthalate, polyethylene isophthalate, chlorinated rubber, cyclized rubber, ethyl cellulose, acetyl cellulose, polyvinyl butyral, polyvinyl formal, or styrenebutadiene rubber. Moreover, other polymers which have the above-described characteristics can also be used as a binder in the photopolymerizable composition of this invention.

Of the above-described polymers, chlorinated polyolefins such as chlorinated polyethylene or chlorinated polypropylene, polymethyl methacrylate, polyvinyl chloride, a copolymer of vinyl chloride with vinylidene chloride (containing about 20 to about 80 mol% vinyl chloride), a copolymer of vinylidene chloride with acrylonitrile (containing about 10 to about 30 mol% acrylonitrile), a copolymer of vinyl chloride with acrylonitrile (containing about 10 to about 30 mol% acrylonitrile), polystyrene, polyvinyl butyral, polyvinyl formal, ethyl cellulose and acetyl cellulose are particularly preferred as a binder for the photopolymerizable composition of this invention.

These polymers can be used individually as a binder, but mixtures of polymers which are quite compatible with each other to the extent that de-mixing does not occur during the preparation steps involving the preparation of a coating composition, coating and drying can be employed in a suitable ratio and used as a binder.

A suitable molecular weight for the high molecular weight materials used as a binder can vary widely depending upon the type of polymers, but usually a molecular weight of about 5,000 to about 2,000,000, particularly 10,000 to 1,000,000, is preferred.

The weight ratio of the total amount of the binders as component (C) to the amount of component (A) can vary over a wide range such that an appropriate image is obtained, depending upon the type of the polymers used, but the weight ratio usually ranges from about 2:1 to about 0.2:1, preferably 1.5:1 to 0.3:1, of the binder as component (C) to component (A).

Suitable additional addenda which can be present in the photopolymerizable composition of this invention are described in greater detail below.

A thermal polymerization inhibitor is preferably added to the photopolymerizable composition of this invention, as in the case of the conventional compositions. Specific examples of suitable thermal polymerization inhibitors are paramethoxyphenol, hydroquinone, alkyl- or aryl-substituted hydroquinones, t-butylcatechol, pyrogallol, cupurous chloride, phenothiazine, chloranil, α-naphthylamine, β-naphthylamine, β-naphthol, 2,6-di-t-butyl-p-cresol, pyridine, nitrobenzene, dinitrobenzene, p-toluidine, Methylene Blue, and organic acid copper salts (such as copper acetate). These thermal polymerization inhibitors can be employed in an amount of about 0.001 to about 5 parts by weight based on 100 parts by weight of component (A).

Coloring agents, for example, pigments such as titanium oxide, carbon black, iron oxide, phthalocyanine pigments or azo pigments and dyes such as Methylene Blue, Crystal Violet, Rhodamine B, Fuchsine, Auramine, azo dyes or anthraquinone dyes can be added to the photopolymerizable composition of this invention. The coloring agent used preferably does not absorb light of the wavelength which is absorbed by the photopolymerization initiator, component (B), employed. The coloring agent can be employed in an amount of about 0.1 to about 3 parts by weight in the case of pigments and in an amount of about 0.01 to about 10 parts by weight in the case of dyes, preferably in an amount of 0.1 to 3 parts by weight in both cases, based on 100 parts by weight of the total amount of the binder (C) and component (A).

Suitable plasticizers which can be used include phthalic esters such as dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate or diaryl phthalate; glycol esters such as dimethylglycol phthalate, ethyl phthalyl ethylglycolate, methyl phthalyl ethylglycolate, butyl phthalyl butylglycolate or triethylene glycol dicaprylate; phosphoric esters such as tricresyl phosphate or triphenyl phosphate; aliphatic dicarboxylic acid esters such as diisobutyl adipate, dioctyl adipate, dimethyl sebacate, dibutyl sebacate, dioctyl azelate or dibutyl maleate; triethyl citrate, glycerin triacetate, butyl laurate, etc. The amount of the plasticizer which can be present will depend upon the type and the molecular weight of the binder or binders used, but generally a suitable range for the amount of the plasticizer is about 5% by weight to about 100% by weight based on the weight of the binder.

A suitable amount of the above-described addenda other than plasticizer and solvent used generally is about 0.01% by weight to about 5% by weight based on the weight of the binder used.

In a most typical embodiment of the photopolymerizable composition of this invention, the composition is used as a material for a light-sensitive layer which is coated on a support. An image-forming element having such a constitution can be prepared by dissolving the above-described components (A) and (B) or (A), (B) and (C) in a solvent to form a coating composition, coating the coating composition on a suitable support and then drying the coating.

Suitable solvents for preparing the coating composition include ketones such as acetone, methyl ethyl ketone, methyl isobutyl ketone, cyclohexanone or diisobutyl ketone; esters such as ethyl acetate, butyl acetate, n-amyl acetate, methyl acetate, ethyl propionate, dimethyl phthalate or ethyl benzoate; aromatic hydrocarbons such as toluene, xylene, benzene or ethylbenzene; halogenated hydrocarbons such as carbon tetrachloride, trichloroethylene, chloroform, 1,1,1-trichloroethane, monochlorobenzene, chloronaphthalene or dichloroethane; ethers such as tetrahydrofuran, diethyl ether, ethylene glycol monomethyl ether or ethylene glycol monoethyl ether acetate; dimethylformamide, dimethyl sulfoxide, etc. A subbing layer necessary to facilitate bonding or an antihalation layer can be provided on the surface of a support, if desired.

The surface of the supports must be uniform. Specific examples of suitable supports which can be used are various synthetic resin films such as those of polyethylene terephthalate, polypropylene, polyethylene, cellulose triacetate, cellulose diacetate, polyvinyl chloride, polyvinyl alcohol, polycarbonates, polystyrene, cellophane (or regenerated cellulose), polyvinylidene chloride copolymers, polyamides, polyimides, vinyl chloride-vinyl acetate copolymers, polytetrafluoroethylene and polytrifluoroethylene. Moreover, laminated materials comprising two or more of these resins can be used. Supports generally having a thickness of about 15 $\mu$m to about 1 mm, preferably of 20 $\mu$m to 250 $\mu$m, are used, but those having a thickness outside the above range can also be used.

The light-sensitive layer is provided on a support so as to have a thickness such that the ultimately formed image can fulfill the desired functions. A suitable light-sensitive layer thickness generally ranges from about 1 $\mu$m to about 100 $\mu$m, preferably from about 2.5 $\mu$m to about 60 $\mu$m.

The prepared image-forming material basically comprises a support having a light-sensitive layer provided thereon. If desired, a protective film can be provided on the light-sensitive layer. The protective film can be appropriately selected from the above-described materials which can be used as a support and papers such as papers laminated with polyethylene, polypropylene, etc. A suitable thickness for the protective film generally ranges from about 8 μm to about 80 μm, preferably from 10 μm to 50 μm. As described above, the photopolymerizable composition of this invention can be used, e.g., as a light-sensitive layer, to produce a light-sensitive image-forming material. Where the ethylenically unsaturated double bond-containing compound as component (A) is capable of forming a film, the light-sensitive layer can comprise a photopolymerizable composition of this invention containing component (A) and component (B). Where the ethylenically unsaturated double bond-containing compound as component (A) is not capable of readily forming a film, the light-sensitive layer can comprise a photopolymerizable composition of this invention containing the binder (C) in addition to components (A) and (B).

The support can be subjected to a surface treatment in order to improve the adhesion to the light-sensitive layer. For example, a subbing layer can be coated on the support, or the support can be subjected to a corona discharge, a flame treatment, an ultraviolet light irradiation, a high-frequency irradiation, a glow discharge, an active plasma irradiation, a laser beam irradiation, etc.

Generally, a surface treatment of the protective film is performed in order to decrease the adhesive strength to the light-sensitive layer in contrast to the purpose of the above-described surface treatment of the support. For example, polyorganosiloxanes, fluorinated polyolefins, polyfluoroethylenes, and the like can be employed as a subbing layer on the protective film.

The image-forming material produced using this invention can be prepared by sufficiently dissolving or dispersing the above-described components (A) and (B), the binder (C) and other optional components in a solvent, coating the solution or dispersion thereof on a support in a suitable manner, drying and, if desired, further superposing a protective layer as described above thereon. Drying after coating is usually performed at about 30° C to about 110° C, preferably 50° C to 90° C, for about 1 minute to about 30 minutes.

The light-sensitive image-forming element prepared as described above can be used to produce an image thereon employing usual image-forming steps. Further, an image can be formed by superposing another material on the light-sensitive layer to form a laminate, peeling off the support and image-wise exposing the light-sensitive layer to light, or in the case where the support is transparent, image-wise exposing through the support and developing simultaneously with peeling off the support or developing with an organic solvent after peeling off the support. However, in general, the image formed by the light-sensitive layer is rarely used as a final image in itself. Usually, the image formed by the light-sensitive layer is used as a resist image, and a material which is present under the light-sensitive layer is image-wise etched to produce a desired image with the element. For example, in the case of an image-forming element in which, e.g., a metallic layer is provided between the light-sensitive layer of this invention and the support, the light-sensitive layer is first image-wise exposed and developed to form an image using the light-sensitive layer, and simultaneously or thereafter, the metallic layer which is present thereunder is etched using the image of the light-sensitive layer as a resist image, thus obtaining a desired metallic image. Alternatively, the light-sensitive layer can be laminated with another material, i.e., a material having a metallic surface layer, as described above, the thus formed laminate is subjected to a suitable treatment to form a resist image, and simultaneously or thereafter, the metallic surface layer is etched to obtain a desired metallic image.

One of the above image-forming processes, in which the image-forming elements comprising the photopolymerizable composition of this invention is subjected to peeling development for forming a metallic image on another material, is described in detail below.

Various materials can be used as a base consisting of another material depending upon the desired use of the image formed. For example, synthetic resin films, papers, wood materials, metallic sheets, glass sheets, and the like which have adhesive property to the light-sensitive layer but are different from those used as the support for the image-forming material can be used. In particular, when the element of this invention is used for the formation of a photo resist image which is employed for preparing a printed circuit, bases for printed circuits in which a thin layer of a metal such as copper, aluminum or silver is adhered or attached by plating on the upper surface or on the under surface of a synthetic resin sheet or to the surface of the inner wall of holes which are made in the synthetic resin sheet, i.e., through-holes, or bases in which a metallic thin layer is provided on a thin synthetic resin film by vapor deposition or plating can be used. Further, when this invention is employed in the preparation of a printing plate, the above-described various types of bases, as well as an aluminum sheet, a synthetic resin film having an aluminum layer provided thereon, and the like can be used. In this case, the surface of the metal such as aluminum may have been subjected to a silicate treatment or an anodizing.

The lamination of the light-sensitive layer with the above-described base can be performed at normal temperature (from about 10° C. to about 40° C.) or under heating (e.g., from about 40° C. to about 60° C.).

Then, the light-sensitive layer and the support which are laminated with the base are image-wise exposed to light through the transparent support and, in general, through an original image.

As a result of the image-wise exposure, component (A) in the exposed areas is polymerized, resulting in a hardened film. As a result, although the light-sensitive layer before exposure exhibits a stronger adhesive strength to the support than to the base, the adhesive strength, after polymerization, becomes stronger to the base than to the support. Thereafter, the support is peeled off. That is, the support to which the light-sensitive layer in the unexposed areas remains attached is removed from the base, while the light-sensitive layer (polymerized and hardened polymer layer) in the exposed areas remains attached to the base. Thus, a positive image to the original image is formed on the support and a corresponding negative image to the original image is formed on the base. Contrary to this, a negative image on the support and a positive image on the base can be obtained by combining the support and the base each having appropriate adhesive property to the light-sensitive layer. The temperature on peeling is not particularly restricted, but a temperature ranging from about 20° C. to about 80° C. is usually preferred.

The photopolymerizable composition of this invention has the characteristic of being sensitive to electromagnetic radiation of wavelengths ranging from about 200 nm to about 600 nm. Therefore, argon laser light of a wavelength of 488 nm can be used in addition to light from a high-pressure mercury lamp, an ultrahigh-pressure mercury lamp, a high-pressure xenon lamp, a halogen lamp and a fluorescent lamp which have been used for exposure of conventional photopolymerizable compositions. This is a superior characteristic as compared with conventional photopolymerizable compositions. In particular, since scanning exposure can be performed using argon laser light, the photopolymerizable composition of this invention has very wide applications. For example, the photopolymerizable composition of this invention can be used as light-sensitive materials in various fields, e.g., in the preparation of printed circuit boards in the electronics industry, the preparation of lithographic or relief printing plates or the reproduction of an optical image. As described above, this invention is very useful.

This invention is illustrated in greater detail by reference to the following examples of this invention and comparative examples. The method and procedures which were employed in the examples were as follows.

(1) Preparation of Light-Sensitive Material Sample

A component (A), a component (B), a binder (C) and other additives were placed in a container together with dichloroethane and stirred for about 3 hours to dissolve the solid materials. Then, the resulting compositon was coated on a grained and anodized aluminum sheet of a thickness of 0.24 mm and dried at a temperature of 80° C.for 10 minutes to obtain a light-sensitive material. The thickness of the dried light-sensitive layer was about 10 μm.

(2) Measurement of the Sensitivity of the Light-Sensitive Material Sample

A transparent polyethylene terephthalate film of a thickness of 25 μm was superposed on the light-sensitive layer of the above-described light-sensitive material. The light-sensitive layer was scanned with an argon laser light beam of a wavelength of 488 nm (the diameter of the beam was 1.5 mm at the surface of the light-sensitive layer and the light amount was 0.2 W at the surface of the light-sensitive layer) at a rate of 6.25 cm/sec, 12.5 cm/sec, 31.25 cm/sec, 62.5 cm/sec, 93.75 cm/sec and 125 cm/sec (the exposure amounts at the above rates correspond to $2.72 \times 10^6$ erg/cm$^2$, $1.36 \times 10^6$ erg/cm$^2$, $5.44 \times 10^5$ erg/cm$^2$, $2.72 \times 10^5$ erg/cm$^2$, $1.81 \times 10^5$ erg/cm$^2$ and $1.36 \times 10^5$ erg/cm$^2$, respectively). Then, the polyethylene terephthalate film was removed and the light-sensitive layer was treated with 1,1,1-trichloroethane (at 23°C.) to dissolve and remove the unexposed, unpolymerized areas. Thus, the light-exposed, polymerized, hardened areas remained behind on the aluminum sheet to form an image. The sensitivity of the sample was expressed in terms of the fastest scanning rate which could be used for the formation of an image. The faster is the scanning rate which was sufficient for the formation of an image, the higher is the sensitivity of the sample.

EXAMPLES 1 TO 16 AND COMPARATIVE EXAMPLES 1 TO 8

According to the above-described method, these examples were prepared and evaluated as shown in Tables 2 and 3 below.

TABLE 2

| Component of Photopolymerizable Composition (wt %) | Example No. | | | | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| Component (A) | | | | | | | | | | | | | | | | |
| *(1) | — | — | — | — | — | — | — | — | 50 | 50 | — | — | — | 25 | — | — |
| *(2) | — | — | — | — | 50 | 50 | 50 | 50 | — | — | — | — | 25 | — | — | — |
| *(3) | 50 | 50 | 50 | 50 | — | — | — | — | — | — | 50 | 50 | 25 | 25 | 50 | 50 |
| Component (B) | | | | | | | | | | | | | | | | |
| Compound (a) | | | | | | | | | | | | | | | | |
| *(4) | 2.5 | — | — | — | — | — | — | — | — | — | — | — | — | — | — | — |
| *(5) | — | 2.5 | — | — | — | — | — | — | 2.5 | — | 2.5 | 2.5 | 2.5 | 2.5 | 1 | — |
| *(6) | — | — | 2.5 | — | — | — | — | — | — | — | — | — | — | — | — | 1 |
| *(7) | — | — | — | 2.5 | 2.5 | 2.5 | 2.5 | 2.5 | — | 2.5 | — | — | — | — | 1.5 | 1.5 |
| Compound (b) | | | | | | | | | | | | | | | | |
| *(8) | 2.5 | 2.5 | 2.5 | 2.5 | — | — | — | — | 2.5 | — | 2.5 | 2.5 | — | — | 2.5 | 1.5 |
| *(9) | — | — | — | — | 2.5 | — | — | — | — | — | — | — | 2.5 | — | — | — |
| *(10) | — | — | — | — | — | 2.5 | — | — | — | — | — | — | — | — | — | — |
| Compound (c) | | | | | | | | | | | | | | | | |
| *(11) | — | — | — | — | — | — | 2.5 | — | — | — | — | — | — | — | — | 1 |
| *(12) | — | — | — | — | — | — | — | 2.5 | — | 2.5 | — | — | — | 2.5 | — | — |
| Binder | | | | | | | | | | | | | | | | |
| *(13) | 45 | 45 | 45 | 45 | 45 | 45 | 45 | 45 | 45 | 45 | — | — | 45 | 40 | 45 | 45 |
| *(14) | — | — | — | — | — | — | — | — | — | — | 45 | — | — | 5 | — | — |
| *(15) | — | — | — | — | — | — | — | — | — | — | — | 45 | — | — | — | — |

TABLE 2-continued

| Component of Photo- polymerizable Composition (wt %) | Example No. | | | | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| Sensitivity *(16) | 12.5 | 12.5 | 31.25 | 93.75 | 12.5 | 31.25 | 62.5 | 93.75 | 6.25 | 6.25 | 93.75 | 93.75 | 93.75 | 62.5 | 62.5 | 62.5 |

Component (A): Ethylenically unsaturated compound
Component (B): Photopolymerization initiator composition
*(1): Pentaerythritol trimethacrylate
*(2): Trimethylolpropane acrylate
*(3): Oligoester acrylate
*(4): 2-Benzoylmethylene-3-ethyl-5-(3'-methylbenzothiazolylidene)thiazolidin-4-one
*(5): 2-Benzoylmethylene-3-ethyl-5-(3'-methyl-5'-methoxybenzothiazolylidene)thiazolidin-4-one
*(6): 2-Benzoylmethylene-3-ethylene-5-(3'-methyl-5'-chlorobenzothiazolylidene)thiazolidin-4-one
*(7): 2-Benzoylmethylene-3-ethyl-5-(3',5'-dimethylbenzothiazolylidene)thiazolidin-4-one
*(8): Triethanolamine
*(9): N,N,N',N'-Tetraethanolethylenediamine
*(10): N,N-Dimethylaniline
*(11): Michler's ketone
*(12): bis(p-Dimethylaminostyryl)ketone
*(13): Chlorinated polyethylene
*(14): Polymethyl methacrylate
*(15): Polyvinyl butyral

*(16): Scanning rate with argon laser light (cm/sec): 0 means no sensitivity; (the larger the value, the higher the sensitivity).

TABLE 3

| Component of Photopolymerizable Composition (wt %) | Comparative Example No. | | | | | | | |
|---|---|---|---|---|---|---|---|---|
| | 1 | 2 | 3 | 4 | 5 | 6 | 7 | 8 |
| Component (A) | | | | | | | | |
| *(1) | 50 | 50 | 50 | 50 | 50 | 50 | 50 | 50 |
| Component (B) | | | | | | | | |
| Compound (a) | | | | | | | | |
| *(2) | — | 5 | — | — | — | — | — | — |
| *(3) | — | — | 5 | — | — | — | — | — |
| *(4) | — | — | — | 5 | — | — | — | — |
| *(5) | — | — | — | — | 5 | — | — | — |
| *(6) | — | — | — | — | — | 5 | — | — |
| Compound (b) | | | | | | | | |
| *(7) | — | — | — | — | — | — | 5 | — |
| Compound (c) | | | | | | | | |
| *(8) | — | — | — | — | — | — | — | 5 |
| Binder | | | | | | | | |
| *(9) | 50 | 45 | 45 | 45 | 45 | 45 | 45 | 45 |
| *(10) | | | | | | | | |
| *(11) | | | | | | | | |
| Sensitivity *(12) | 0 | <6.25 | <6.25 | <6.25 | <6.25 | <6.25 | 0 | 0 |

<6.25 means a value smaller than 6.25.
Component (A): Ethylenically unsaturated compound
Component (B): Photopolymerization initiator composition
Note
*(1): Oligoester acrylate
*(2): 2-Benzoylmethylene-3-ethyl-5-(3'-methylbenzothiazolylidene)thiazolidin-4-one
*(3): 2-Benzoylmethylene-3-ethyl-5-(3'-methyl-5'-methoxybenzothiazolylidene)thiazolidin-4-one
*(4): 2-Benzoylmethylene-3-ethylene-5-(3'-methyl-5'-chlorobenzothiazolylidene)thiazolidin-4-one
*(5): 2-Benzoylmethylene-3-ethyl-5-(3',5'-dimethylbenzothiazolylidene)thiazolidin-4-one
*(6): 2-Dibenzoylmethylene-3-ethyl-5-(3'-methylbenzothiazolylidene)thiazolidin-4-one
*(7): Triethanolamine
*(8): Michler's ketone
*(9): Chlorinated polyethylene
*(10): Polymethyl methacrylate
*(11): Polyvinyl butyral
*(12): As described in Table 2.

As can be seen from the results shown for "Sensitivity" in Tables 2 and 3 above, the samples prepared using the photopolymerizable compositions of this invention exhibited a sensitivity necessary for the formation of an image even to argon laser light and desired images could be formed by the above-described procedures. However, the samples in which the conventional photopolymerization initiators of the Comparative Examples were used were not sensitive to argon laser light and images could not be obtained at all.

Regarding the samples prepared using the compositions shown in Examples of this invention, when the samples were prepared by firmly adhering under pressure the polyethylene terephthalate film to the light-sensitive layer to form a laminate, all of the samples could be developed by peeling off the film after they had been scanned at a scanning rate at which an image could be formed.

While the invention has been described in detail and with reference to specific embodiments thereof, it will be apparent to one skilled in the art that various changes and modifications can be made therein without departing from the spirit and scope thereof.

What is claimed is:

1. A photopolymeric composition comprising, as essential components, (A) at least one compound having one or more addition polymerizable ethylenically unsaturated double bonds and (B) a photopolymerization initiator composition comprising (i) a combination of at least one compound (a) and at least one compound (b), (ii) a combination of at least one compound (a) and at least one compound (c) or (iii) a combination of at least one compound (a), at least one compound (b) and at least one compound (c);

wherein compound (a) is a benzoylmethylenebenzothiazolylidenethiazolidone compound selected from the group consisting of 2-benzoylmethylene-5-benzothiazolylidene-thiazolidin-4-one and the substituted derivatives thereof represented by the following general formula (I):

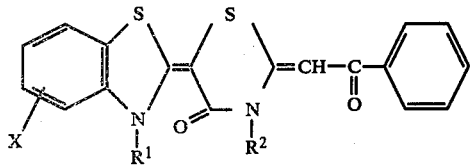 (I)

wherein $R^1$ and $R^2$, which may be the same or different, each represents a hydrogen atom, an alkyl group, a substituted alkyl group, an aryl group, a substituted aryl group or an aralkyl group and X represents a substituent exhibiting a Hammett's sigma ($\sigma$) constant ranging from about $-0.9$ to about $+0.5$;

compound (b) is a tertiary or polyamine compound selected from the group consisting of tertiary amines represented by the following general formula (II):

 (II)

wherein $R^3$, $R^4$ and $R^5$, which may be the same or different, each represents an alkyl group, a substituted alkyl group, an aryl group, a substituted aryl group or an aralkyl group; and polyamines; and compound (c) is a disubstituted aminoarylcarbonyl compound selected from the group consisting of p-(disubstituted amino)benzophenones, p-(disubstituted amino)acetophenones, p-(disubstituted amino)propiophenones, bis [p-(disubstituted amino)phenyl]ketones, p-(disubstituted amino)phenyl styryl ketones, 4-(disubstituted amino)benzoins, p-(disubstituted amino) benzaldehydes, p-(disubstituted amino)benzoic esters, 4-(disubstituted amino)-1-naphthaldehydes, p-(disubstituted amino)styryl phenyl ketones and p-(disubstituted amino)styryl styryl ketones, wherein the substituents, which may be the same or different, of the above-described disubstituted amino groups are an alkyl group, an aryl group, an alkylaryl group or an aralkyl group and wherein, in addition to the disubstituted amino group, the carbon atoms of the aryl ring having the disubstituted amino group thereon or the carbon atoms of another aryl ring where another aryl ring is present of the disubstituted aminoarylcarbonyl compounds may be substituted with one or more substituents exhibiting a Hammett's sigma ($\sigma$) constant ranging from about $-0.9$ to about $+0.7$.

2. The photopolymerizable composition of claim 1, wherein said addition polymerizable ethylenically unsaturated double bond-containing compound is an ester of an ethylenically unsaturated double bond-containing organic acid with an aliphatic polyhydric alcohol, an oligoester (meth)acrylate prepared by the esterification of acrylic acid and/or methacrylic acid, one or more polybasic acids and one or more polyhydric alcohols.

3. The photopolymerizable composition of claim 1, wherein said addition polymerizable ethylenically unsaturated double bond-containing compound is trimethylolpropane triacrylate, trimethylolethane triacrylate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol trisitaconate, dipentaerythritol pentaitaconate, dipentaerythritol hexaitaconate, ethylene glycol dimethacrylate, 1,3-butanediol diacrylate, 1,3-butanediol dimethacrylate, 1,4-butanediol diitaconate, sorbitol triacrylate, sorbitol tetraacrylate, sorbitol tetramethacrylate, sorbitol pentaacrylate, sorbitol hexaacrylate, 1,4-butylene modified diacrylate, trimethylolpropane modified triacrylate, pentaerythritol modified triacrylate, an oligoester acrylate, an oligoester methacrylate, or a mixture thereof.

4. The photopolymerizable composition of claim 1, wherein said substituent X in the general formula (I) is a hydrogen atom, an alkyl group having 1 to 4 carbon atoms, a phenyl group, a trifluoromethyl group, an acetyl group, an ethoxycarbonyl group, a carboxyl group, a carboxylato group, an amino group, a methylamino group, a dimethylamino group, an ethylamino group, a diethylamino group, an acetylamino group, a —$PO_3H$ group, a methoxy group, an ethoxy group, a propoxy group, an isopropoxy group, a butoxy group, a pentyloxy group, a phenoxy group, a hydroxy group, an acetoxy group, a methylthio group, an ethylthio group, an isopropylthio group, a mercapto group, an acetylthio group, a thiocyano group, a methylsulfinyl group, an ethylsulfinyl group, a methylsulfonyl group, an ethylsulfonyl group, an aminosulfonyl group, a dimethylsulfonio group, a sulfonato group, a fluorine atom, a chlorine atom, a bromine atom, an iodine atom, an iodyl group, a trimethylsilyl group, a triethylsilyl group or a trimethylstannyl group.

5. The photopolymerizable composition of claim 1, wherein for $R^1$, $R^2$, $R^3$, $R^4$ and $R^5$, said alkyl group is a straight chain, branched or cyclic group having 1 to 18 carbon atoms; said substituted alkyl group is a substituted alkyl group containing a straight chain, branched chain or cyclic alkyl moiety having 1 to 18 carbon atoms substituted with one or more of a halogen atom or a hydroxy group; said aryl group is a residue of a benzene ring, a residue of two or more condensed benzene rings, a residue of two combined benzene rings or a residue of a condensed ring formed from a benzene ring and a 5-membered unsaturated ring; said substituted aryl group is an aryl group comprising the residues described above for said aryl group and substituted with one or more of a halogen atom, a nitro group, an amino group, a substituted amino group, a cyano group, an alkyl group, a haloalkyl group, an alkoxy group, an aryloxy group, an alkoxycarbonyl group, an acyloxy group, or an alkoxysulfonyl group; and said aralkyl group is an aralkyl group containing an alkyl moiety which may be the residue of a straight chain, branched chain or cyclic alkyl group having 1 to 10 carbon atoms substituted with a phenyl group or a naphthyl group.

6. The photopolymerizable composition of claim 1, wherein said benzoylmethylenebenzothiazolylidenethiazolidone is 2-benzoylmethylene-3-methyl-5-(3'-methylbenzothiazolylidene)thiazolidin-4-one, 2-benzoylmethylene-3-ethyl-5-(3'-methyl-benzothiazolylidene)thiazolidin-4-one, 2-benzoylmethylene-3-methyl-5-(3'-methyl-5'-methoxybenzothiazolylidene)thiazolidin-4-one, 2-benzoylmethylene-3-ethyl-5-(3'-methyl-5'-methoxy-benzothiazolylidene)thiazolidin-4-one, 2-benzoylmethylene-3-ethyl-5-(3'-methyl-5'-chlorobenzothiazolylidene)thiazolidin-4-one, 2-benzoylmethylene-3-ethyl-5-(3',5'-dimethylbenzothiazolylidene)thiazolidin-4-one, 2-benzoylmethylene-3-ethyl-5-(3'-ethyl-5'methoxybenzothiazolylidene)-thiazolidin-4-one, or 2-benzoylmethylene-3-methyl-5-(3'-ethyl-5'-chlorobenzothiazolylidene)thiazolidin-4-one.

7. The photopolymerizable composition of claim 1, wherein said tertiary amine represented by the general formula (II) or polyamine as compound (b) is trimethylamine, triethylamine, tripropylamine, tributylamine, tripentylamine, tri(decyl)amine, methyldiethylamine, ethyldibutylamine, dimethyldecylamine, dimethylcyclohexylamine, diethylcyclohexylamine, N,N-dimethylaniline, N,N-diethylaniline, N,N-dimethylbenzylamine, N,N-diethylbenzylamine, N-benzyl-N-methylaniline, N-benzyl-N-ethylaniline, N-benzyl-N-propyl-aniline, N-phenethyl-N-methylaniline, N-phenethyl-N-ethylaniline, N-N-diphenylaniline, N,N-dibenzylaniline, triphenylamine, tribenzylamine, nitrilotrimethanol, 2,2',2''-nitrilotriethanol, 1,1',1''-nitrilotripropanol, 2,2',2''-nitrilotripropanol, N,N-diethanolaniline, p-methyl-N,N-dimethylaniline, p-nitro-N,N-dimethylaniline, bis[(p-dimethylamino)phenyl]methane, bis[(p-dibenzylamino)phenyl]methane, methylenediamine, ethylenediamine, trimethylenediamine, tetramethylenediamine, pentamethylenediamine, hexamethylenediamine, decamethylenediamine, propylenediamine, butylenediamine, 1,4-cyclohexanediamine, phenylenediamine, (2-aminomethylbutyl)amine, diethylenetriamine, triethylenetetramine or hexamethylenetetramine.

8. The photopolymerizable composition of claim 1, wherein said p-(disubstituted amino)benzophenone is p-(dimethylamino)benzophenone or p-(diethylamino)benzophenone; said p-(disubstituted amino)acetophenone is p-(dimethylamino)acetophenone or p-(diethylamino)acetophenone; said p-(disubstituted amino)propiophenone is p-(dimethylamino)propiophenone or p-(diethylamino)propiophenone; said bis[p-(disubstituted amino)phenyl]ketone is bis[p-(dimethylamino)phenyl]ketone or bis[p-(diethylamino)phenyl]ketone; said p-(disubstituted amino)phenyl styryl ketone is p-(dimethylamino)phenyl styryl ketone, p-(dimethylamino)phenyl p-methylstyryl ketone, p-(dimethylamino)phenyl m-chlorostyryl ketone, p-(dimethylamino)phenyl p-methoxystyryl ketone, p-(dimethylamino)phenyl p-(dimethylamino)styryl ketone, p-(diethylamino)phenyl styryl ketone, p-(diethylamino)phenyl m-methylstyryl ketone, p-(diethylamino)phenyl p-bromostyryl ketone or p-(diethylamino)-phenyl p-methoxystyryl ketone; said 4-(disubstituted amino)benzoin is 4-(dimethylamino)benzoin or 4-(diethylamino)benzoin; said p-(disubstituted amino)benzaldehyde is p-(dimethylamino)benzaldehyde, p-dimethylamino-m-chlorobenzaldehyde, p-dimethylamino-m-methylbenzaldehyde, p-(diethylamino)benzaldehyde, p-diethylamino-m-bromobenzaldehyde or p-diethylamino-m-methoxybenzaldehyde; said p-(disubstituted amino)benzoic ester is methyl p-(dimethylamino)benzoate, ethyl p-(dimethylamino)benzoate, benzyl p-(dimethylamino)benzoate, methyl p-(diethylamino)benzoate or ethyl p-(diethylamino)benzoate; said 4-(disubstituted amino)-1-naphthaldehyde is 4-dimethylamino-1-naphthaldehyde or 4-diethylamino-1-naphthaldehyde; said p-(disubstituted amino)styryl phenyl ketone is p-(dimethylamino)styryl phenyl ketone, p-(dimethylamino)styryl p-tolyl ketone, p-dimethylamino)styryl m-chlorophenyl ketone, p-(dimethylamino)styryl p-methoxyphenyl ketone, p-(diethylamino)styryl phenyl ketone, p-(diethylamino)styryl p-bromophenyl ketone or p-(diethylamino)styryl p-methoxyphenyl ketone; and said p-(disubstituted amino)styryl styryl ketone is p-(dimethylamino)styryl styryl ketone, p-(dimethylamino)styryl p-methylstyryl ketone, p-(dimethylamino)styryl m-chlorostyryl ketone, p-(dimethylamino)styryl p-methoxystyryl ketone, p-(diethylamino)styryl styryl ketone, p-(diethylamino)styryl p-bromostyryl ketone or p-(diethylamino)styryl m-methylstyryl ketone.

9. The photopolymerizable composition of claim 1, wherein in said photopolymerization initiator, the weight ratio of compound (a) to (b) and/or (c) ranges from about 1:9 to about 9:1, and the weight ratio of compound (b) to compound (c) ranges from about 1:100 to about 100:1.

10. The photopolymerizable composition of claim 1, wherein the weight ratio of component (A) to component (B) ranges from about 100:1 to about 100:20.

11. The photopolymerizable composition as claimed in claim 1, which further contains (C) a high molecular material which is compatible with the ethylenically unsaturated compound (A) and the photopolymerization initiator composition (B) and has a film-forming ability.

12. The photopolymerizable composition of claim 11, wherein said high molecular weight material (C) is a high molecular weight material having a molecular weight of about 5,000 to about 2,000,000.

13. The photopolymerizable composition of claim 11, wherein the weight ratio of component (C) to component (A) ranges from about 2:1 to about 0.02:1.

14. The photopolymerizable composition of claim 11, wherein said addition polymerizable ethylenically unsaturated double bond-containing compound is an ester of an ethylenically unsaturated double bond-containing organic acid with an aliphatic polyhydric alcohol or an oligoester (meth)acrylate prepared by the esterification of acrylic acid and/or methacrylic acid, one or more polybasic acids and one or more polyhydric alcohols.

15. The photopolymerizable composition of claim 11, wherein said addition polymerizable ethylenically unsaturated double bond-containing compound is trimethylolpropane triacrylate, trimethylolethane triacrylate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol trisitaconate, dipentaerythritol pentaitaconate, dipentaerythritol hexaitaconate, ethylene glycol dimethacrylate, 1,3-butanediol diacrylate, 1,3-butanediol dimethacrylate, 1,4-butanediol diitaconate, sorbitol triacrylate, sorbitol tetraacrylate, sorbitol tetramethacrylate, sorbitol pentaacrylate, sorbitol hexaacrylate, 1,4-butylene modified diacrylate, trimethylolpropane modified triacrylate, pentaerythritol modified triacrylate, an oligoester acrylate, an oligoester methacrylate, or a mixture thereof.

16. The photopolymerizable composition of claim 11, wherein said substituent X in the general formula (I) is a hydrogen atom, an alkyl group having 1 to 4 carbon atoms, a phenyl group, a trifluoromethyl group, an acetyl group, an ethoxycarbonyl group, a carboxyl group, a carboxylato group, an amino group, a methylamino group, a dimethylamino group, an ethylamino group, a diethylamino group, an acetylamino group, a —PO$_3$H group, a methoxy group, an ethoxy group, a propoxy group, an isopropoxy group, a butoxy group, a pentyloxy group, a phenoxy group, a hydroxy group, an acetoxy group, a methylthio group, an ethylthio group, an isopropylthio group, a mercapto group, an acetylthio group, a thiocyano group, a methylsulfinyl group, an ethylsulfinyl group, a methylsulfonyl group, an ethylsulfonyl group, an aminosulfonyl group, a dimethylsulfonio group, a sulfonato group, a fluorine atom, a chlorine atom, a bromine atom, an iodine atom, an iodyl group, a trimethylsilyl group, a triethylsilyl group or a trimethylstannyl group.

17. The photopolymerizable composition of claim 11, wherein for R$^1$, R$^2$, R$^3$, R$^4$ and R$^5$, said alkyl group is a straight chain, branched or cyclic group having 1 to 18 carbon atoms; said substituted alkyl group is a substituted alkyl group containing a straight chain, branched chain or cyclic alkyl moiety having 1 to 18 carbon atoms substituted with one or more of a halogen atom or a hydroxy group; said aryl group is a residue of a benzene ring, a residue of two or more condensed benzene rings, a residue of two combined benzene rings or a residue of a condensed ring formed from a benzene ring and a 5-membered unsaturated ring; said substituted aryl group is an aryl group comprising the residues described above for said aryl group and substituted with one or more of a halogen atom, a nitro group, an amino group, a substituted amino group, a cyano group, an alkyl group, a haloalkyl group, an alkoxy group, an aryloxy group, an alkoxycarbonyl group, an acyloxy group, or an alkoxysulfonyl group; and said aralkyl group is an aralkyl group containing an alkyl moiety which may be the residue of a straight chain, branched chain or cyclic alkyl group having 1 to 10 carbon atoms substituted with a phenyl group or a naphthyl group.

18. The photopolymerizable composition of claim 11, wherein said benzoylmethylenebenzothiazolylidenethiazolidone is 2-benzoylmethylene-3-methyl-5(3'-methylbenzothiazolylidene)thiazolidin-4-one, 2-benzoylmethylene-3-ethyl-5-(3'-methylbenzothiazolylidene)thiazolidin-4-one, 2-benzoylmethylene-3-methyl-5-(3'-methyl-5'-methoxybenzothiazolylidene)thiazolidin-4-one, 2-benzoylmethylene-3-ethyl-5-(3'-methyl-5'-methoxybenzothiazolylidene)thiazolidin-4-one, 2-benzoylmethylene-3-ethyl-5-(3'-methyl-5'-chlorobenzothiazolylidene)thiazolidin-4-one, 2-benzoylmethylene-3-ethyl-5-(3',5'-dimethylbenzothiazolylidene)thiazolidin-4-one, 2-benzoylmethylene-3-ethyl-5-(3'-ethyl-5'-methoxybenzothiazolylidene)thiazolidin4-one, or 2-benzoylmethylene-3-methyl-5-(3'-ethyl-5'-chlorobenzothiazolylidene)thiazolidin-4-one.

19. The photopolymerizable composition of claim 11, wherein said tertiary amine represented by the general formula (II) or polyamine as compound (b) is trimethylamine, triethylamine, tripropylamine, tributylamine, tripentylamine, tri(decyl)amine, methyldiethylamine, ethyldibutylamine, dimethyldecylamine, dimethylcyclohexylamine, diethylcyclohexylamine, N,N-dimethylaniline, N,N-diethylaniline, N,N-dimethylbenzylamine, N,N-diethylbenzylamine, N-benzyl-N-methylaniline, N-benzyl-N-ethylaniline, N-benzyl-N-propylaniline, N-phenethyl-N-methylaniline, N-phenethyl-N-ethylaniline, N,N-diphenylaniline, N,N-dibenzylaniline, triphenylamine, tribenzylamine, nitrilotrimethanol, 2,2',2''-nitrilotriethanol, 1,1',1''-nitrilotripropanol, 2,2',2''-nitrilotripropanol, N,N-diethanolaniline, p-methyl-N,N-dimethylaniline, p-nitro-N,N-dimethylaniline, bis[(p-dimethylamino)phenyl]methane, bis[(p-dibenzylamino)phenyl]methane, methylenediamine, ethylenediamine, trimethylenediamine, tetramethylenediamine, pentamethylenediamine, hexamethylenediamine, dicamethylenediamine, propylenediamine, butylenediamine, 1,4-cyclohexanediamine, phenylenediamine, (2-aminomethylbutyl)amine, diethyleneytriamine, triethylenetetramine or hexamethylenetetramine.

20. The photopolymerizable composition of claim 11, wherein said p-(disubstituted amino)benzophenone is p-(dimethylamino)benzophenone or p-(diethylamino)benzophenone; said p-(disubstituted amino)acetophenone is p-(dimethylamino)acetophenone or p-(diethylamino)acetophenone; said p-(disubstituted amino)propiophenone is p-(dimethylamino)propiophenone or p-(diethylamino)propiophenone; said bis[p-(disubstituted amino)phenyl]ketone is bis[-p-(dimethylamino)phenyl]ketone or bis[p-(diethylamino)phenyl]ketone; said p-(disubstituted amino)phenyl styryl ketone is p-(dimethylamino)phenyl styryl ketone, p-(dimethylamino)phenyl p-methylstyryl ketone, p-(dimethylamino)phenyl m-chlorostyryl ketone, p-(dimethylamino)phenyl p-methoxystyryl ketone, p-(dimethyl-amino)phenyl p-(dimethylamino)styryl ketone, p-(diethylamino)phenyl styryl ketone, p-(diethylamino)phenyl m-methylstyryl ketone, p-(diethylamino)phenyl p-bromostyryl ketone or p-(diethylamino)phenyl p-methoxystyryl ketone; said 4-(disubstituted amino)benzoin is 4-(dimethylamino)benzoin or 4-(diethylamino)benzoin; said p-(disubstituted amino)benzaldehyde is p-(dimethylamino)benzaldehyde, p-dimethylamino-m-chlorobenzaldehyde, p-dimethylamino-m-methylbenzaldehyde, p-(diethylamino)benzaldehyde, p-diethylamino-m-bromobenzaldehyde or p-diethylamino-m-methoxybenzaldehyde; said p-(disubstituted amino)benzoic ester is methyl p-(dimethylamino)benzoate, ethyl p-(dimethylamino)benzoate, benzyl p-(diethylamino)benzoate, methyl p-(diethylamino)benzoate or ethyl p-(diethylamino)benzoate; said 4-(disubstituted amino)-1-naphthaldehyde is 4-dimethylamino-1-naphthaldehyde or 4-diethylamino-1naphthaldehyde; said p-(disubstituted amino)styryl phenyl ketone is p-(dimethylamino)styryl phenyl ketone, p-(dimethylamino)styryl p-tolyl ketone, p-(dimethylamino)styryl m-chlorophenyl ketone, p-(dimethylamino)styryl p-methoxyphenyl ketone, p-(diethylamino)styryl phenyl ketone, p-(diethylamino)styryl p-bromophenyl ketone or p-(diethylamino)styryl p-methoxyphenyl ketone; and said p-(disubstituted amino)styryl styryl ketone is p-(dimethylamino)styryl ketone, p-(dimethylamino)styryl p-methylstyryl ketone, p-(dimethylamino)styryl m-chlorostyryl ketone, p-(dimethylamino)styryl p-methoxystyryl ketone, p-(diethylamino)styryl styryl ketone, p-(diethylamino)styryl p-bromostyryl ketone or p-(diethylamino)styryl m-methylstyryl ketone.

21. The photopolymerizable composition of claim 11, wherein in said photopolymerization initiator, the weight ratio of compound (a) to (b) and/or (c) ranges from about 1:9 to about 9:1, and the weight ratio of compound (b) to compound (c) ranges from about 1:100 to about 100:1.

22. The photopolymerizable composition of claim 11, wherein the weight ratio of component (A) to component (B) ranges from about 100:1 to about 100:20.

* * * * *